US007565216B2

(12) United States Patent
Soucy

(10) Patent No.: US 7,565,216 B2
(45) Date of Patent: Jul. 21, 2009

(54) CLEARANCE MEASUREMENT OF MANUFACTURED PARTS

(75) Inventor: Marc Soucy, Québec (CA)

(73) Assignee: Innovmetric Logiciels Inc., Quebec, Quebec (CA)

( * ) Notice: Subject to any disclaimer, the term of this patent is extended or adjusted under 35 U.S.C. 154(b) by 45 days.

(21) Appl. No.: 11/518,129

(22) Filed: Sep. 11, 2006

(65) Prior Publication Data

US 2008/0065251 A1    Mar. 13, 2008

(51) Int. Cl.
*G06F 19/00* (2006.01)
(52) U.S. Cl. .................. 700/98; 700/178; 700/182; 345/419; 345/619
(58) Field of Classification Search .......... 700/97, 700/98, 178, 180, 182, 255, 419, 619, 620, 700/95; 345/419, 619, 620, 420; 703/7, 703/22, 1, 6
See application file for complete search history.

(56) References Cited

U.S. PATENT DOCUMENTS

| 5,257,203 | A | * | 10/1993 | Riley et al. | 700/182 |
|---|---|---|---|---|---|
| 5,343,385 | A | * | 8/1994 | Joskowicz et al. | 700/255 |
| 5,497,453 | A | * | 3/1996 | Megahed et al. | 345/422 |
| 5,552,992 | A | * | 9/1996 | Hunter | 700/182 |
| 5,943,056 | A | * | 8/1999 | Sato et al. | 345/419 |
| 6,091,999 | A | * | 7/2000 | Crump et al. | 700/112 |
| 6,144,890 | A | * | 11/2000 | Rothkop | 700/182 |
| 6,452,604 | B1 | * | 9/2002 | Sato | 345/619 |
| 6,708,071 | B1 | * | 3/2004 | Turner | 700/98 |
| 6,725,184 | B1 | | 4/2004 | Gadh et al. | |
| 6,901,356 | B1 | * | 5/2005 | Arita | 700/178 |
| 6,922,599 | B2 | * | 7/2005 | Richey | 700/98 |
| 6,973,358 | B2 | | 12/2005 | Yamamoto et al. | |
| 7,032,201 | B1 | * | 4/2006 | Teig et al. | 716/7 |
| 2003/0033041 | A1 | * | 2/2003 | Richey | 700/98 |
| 2006/0155402 | A1 | * | 7/2006 | Read | 700/97 |

FOREIGN PATENT DOCUMENTS

WO    WO2005/010627    2/2005

OTHER PUBLICATIONS

Denis Zayia, Probing Technology Moves Ahead, Manufacturing Engineering May 2004, vol. 132, No. 5.

(Continued)

*Primary Examiner*—Albert DeCady
*Assistant Examiner*—Charles R Kasenge
(74) *Attorney, Agent, or Firm*—Ogilvy Renault, LLP

(57) ABSTRACT

There is provided a method for determining an interference between a first physical part and a second part in an assembly of manufactured parts. The method comprises: acquiring three-dimensional digital data representing the first physical part; forming a virtual representation of the first physical part using the digital data; placing the virtual representation of the first physical part and a virtual representation of the second part in a common reference frame, the second part corresponding to one of a second physical part and a nominal part; and determining the interference between the first physical part and the second part using the virtual representation of the first physical part and the virtual representation of the second part.

14 Claims, 8 Drawing Sheets

OTHER PUBLICATIONS

Patrick Waurzyniak, Programming CMMs, Manufacturing Engineering, May 2004, vol. 132, No. 5.

Tecnomatix, Factory Structure Editor (FSE), Extending PDM data management to optimize the development of facility layouts, www.ugs.com.

Tecnomatix, FactoryFlow, Material flow optimization for compressing time to launch and reducing indirect labour costs, www.ugs.com.

Tecnomatix, FactoryCAD, 3D factory layout software to design better factories faster, www.ugs.com.

Lattice3D, Products XVL Studio Pro, www.lattice3d.com.

* cited by examiner

CLEARANCE MEASUREMENT OF MANUFACTURED PARTS

CROSS-REFERENCE TO RELATED APPLICATIONS

This is the first application filed for the present invention.

TECHNICAL FIELD

The present invention relates to the field of computer aided design (CAD) and computer assisted fabrication (CAF), and more specifically to the manufacturing of parts to be assembled together.

BACKGROUND OF THE INVENTION

In manufacturing processes, such as in automobile construction, multiple individual parts are designed, fabricated, and assembled together, to form a whole. When the individual parts are designed, it is important to ensure that a certain level of clearance is provided between parts that are to be assembled together, i.e. that they do not overlap or interfere such that they cannot be assembled together.

Clearance measurements are typically done when the parts are being designed, and using software that can manipulate the parts to virtually assemble the designed parts. However, these nominal parts do not always correspond to the actual parts that are fabricated, especially in assembly-line fabrication processes, where errors are often introduced randomly, either by human error or the use of imprecise equipment.

When the actual parts are then assembled, interfering or overlapping parts must be discarded, thereby increasing the overall costs of manufacture. Accordingly, there is a continuing need to provide improvements in this field.

SUMMARY OF THE INVENTION

According to one aspect of the invention, there is provided a method for determining an interference between a first physical part and a second part in an assembly of manufactured parts, the method comprising: acquiring three-dimensional digital data representing the first physical part; forming a virtual representation of the first physical part using the digital data; placing the virtual representation of the first physical part and a virtual representation of the second part in a common reference frame, the second part corresponding to one of a second physical part and a nominal part; and determining the interference between the first physical part and the second part using the virtual representation of the first physical part and the virtual representation of the second part.

According to another aspect of the invention, there is provided a system for determining an interference between a first physical part and a second part in an assembly of manufactured parts, the system comprising: an acquisition device for acquiring three-dimensional digital data representing the first physical part; a virtual assembling module for receiving the three-dimensional digital data, forming a virtual representation of the first physical part using the digital data, and placing the virtual representation of the first physical part and a virtual representation of the second part in a common reference frame, the second part corresponding to one of a second physical part and a nominal part; and a calculation module for determining the interference between the first physical part and the second part using the virtual representation of the first physical part and the virtual representation of the second part.

In this specification, the following terms are to be understood as follows.

Surface: A continuum of connected points that form the boundary between the interior and the exterior of an object.

Surface Orientation: At a given point, the normal vector to a surface is always oriented towards the exterior of a three-dimensional object, i.e. in a direction opposite to the object's volume.

Physical Part: A physical, real and tangible object.

3D Measurement Device: A high-density acquisition or measurement system capable of measuring millions of points on the Surface of a Physical Part. High-density three-dimensional digitizing principles comprise, without limitation, white-light digitizers (e.g. Atos, Comet, Optigo, etc.), laser scanners mounted on a CMM/articulated arm, or tracked by an optical tracker (e.g. Faro, Perceptron, Leica, etc.), or industrial X-ray scanning devices (e.g. BIR, Phoenix X-ray, etc.).

Measured Part: A Physical Part whose Surface has been measured by a 3D Measurement Device, and which may be virtually represented using the digital data measured with the 3D measurement device or acquisition device.

Measured Part Geometry: The geometrical or virtual representation of a measured part may consist of either a list of points, a list of polygons, or a list of NURBS surfaces.

Nominal Part: The Surface of the ideal part that should be produced, as designed in CAD/CAM software. A nominal part is thus a virtual part produced by a computer software.

Nominal Part Geometry: The geometrical or virtual representation of a nominal part may consist of either a list of points, a list of polygons, or a list of NURBS surfaces.

Virtual Assembly: A collection of Measured and/or Nominal Parts defined in a common coordinate system. The transformation of a Part Geometry into the common coordinate system can be performed by using any method.

Thin Part: A part whose thickness is very small compared to the part's dimensions, such as a sheet metal part.

Virtual Thickness: Only one side of a Measured Thin Part Geometry or Nominal Thin Part Geometry may be available, in which case the opposite side's geometry is described by a single value called the Virtual Thickness. The Virtual Thickness is the thickness of the Part's material, and the opposite side can be computed by offsetting the available side by the Virtual Thickness value.

Clearance: The distance between a first Part B and a given point p on a second Part A within an assembly of various parts comprising Part A and Part B. If Part B is located outside of the volume of part A at p, parts A and B do not interfere at p, and the clearance is positive. If Part B is located inside the volume of part A at p, parts A and B interfere at p, and the clearance is negative.

Minimum Clearance: The smallest signed clearance value computed at a given point p on a given part A, after having computed the clearance values with respect to all possible parts other than A in the Assembly.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

An embodiment of the invention consists of a complete system that can be used to measure clearance and minimum clearance at any given point on any given part's surface with respect to other parts within an assembly. At least one part in the assembly is measured by a 3D measurement device.

Figure 1A:
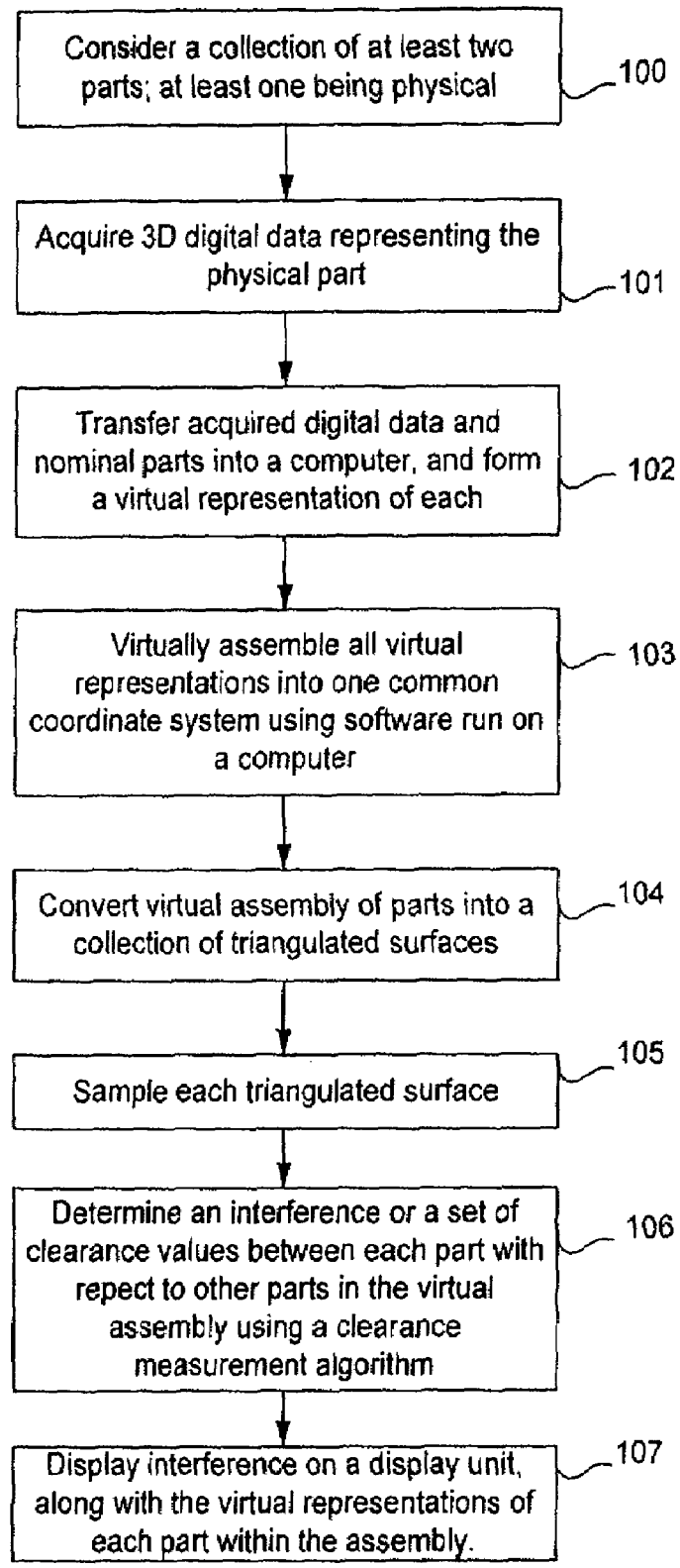
FIG. 1a is a flow chart illustrating the method for measuring a clearance value according to one embodiment.

FIG. 1a demonstrates the method for determining an interference between a first physical part and a second part within an assembly of manufactured parts. The second part can be either physical or nominal. Considering a collection of at least two parts, either physical or nominal, as detailed in step 100, there is at least one physical part. In step 101, the physical part is measured using a 3D scanning or acquisition device to collect digital data representing the physical part. The presence of nominal parts is optional. In step 102, both the measured parts or digital data, and the nominal parts are transferred into a computer system for future processing, wherein virtual representations of each part are formed. In step 103, all virtual representations are virtually assembled into one common coordinate system using any software method or algorithm available. In a similar manner, each part may be located within its own coordinate system, wherein all coordinate systems are the same, such that the distances with respect to the environment can be evaluated. Therefore, after step 103, a collection of virtual parts are virtually assembled together.

In step 104, the measured and nominal part geometries, or the virtual representations of all the parts forming the virtual assembly, are converted into collections of triangles, or triangulated surfaces, by any method or triangulation algorithm available. A triangulated surface is constructed from a set of triangles having three vertices. Each part (either measured or nominal), or more specifically each triangulated surface, is then sampled in step 105. Sampling a triangulated surface consists in determining a set of points that lie on the surface. The set of points are thus either points located within a specific triangle or form the vertices of a specific triangle forming the triangulated surface. Any sampling method is acceptable as long as for each location on the triangulated surface, one extracts an (x,y,z) location and an (i,j,k) vector normal to the triangulated surface at (x,y,z). Steps 104 and 105 can be omitted in certain circumstances depending on the type of interference calculation employed. Steps 104 and 105 are performed using any algorithm available, as long as an interference value can be determined as detailed in step 106. An interference or a set of clearance values are hence determined in step 106. For each sampled point on each part, the clearance values with respect to the other parts in the assembly are computed, as well as the minimum clearance value of one part with respect to all the other parts within the assembly. The algorithm for computing clearance values is further detailed below. Once the clearance values are determined, interferences can be visualized in any particular format, on a display unit, as detailed in step 107. For example, the virtual representations of each part can be displayed, thereby mapping the interferences on a screen, possibly using a value-to-color coding scheme.

Figure 1B:
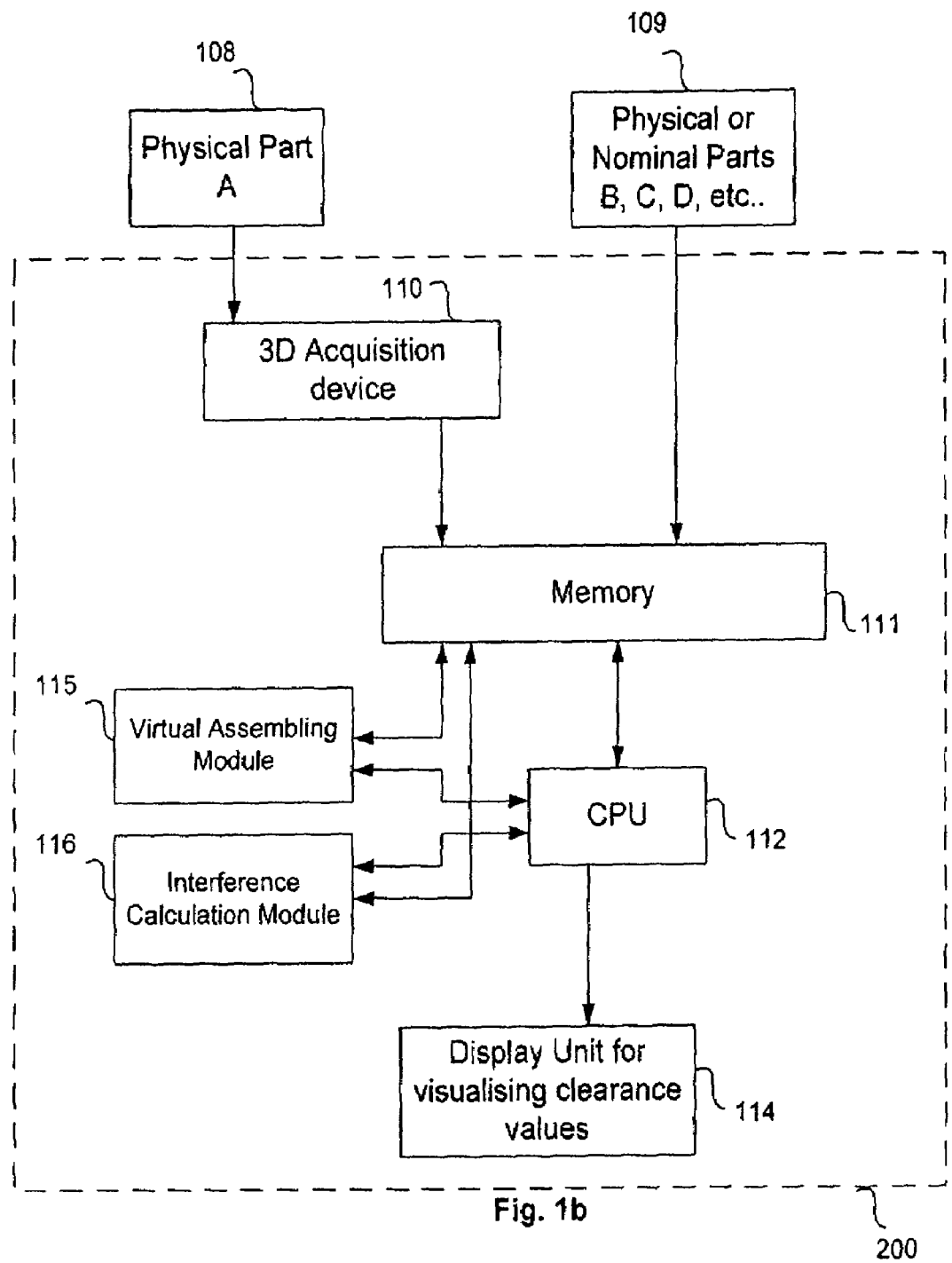
FIG. 1b shows the system necessary for carrying out the method illustrated in FIG. 1a and to measure clearance values.

FIG. 1b illustrates one embodiment of the system 200 for determining an interference between a first physical part and a second part within an assembly. The system can implement the method described above. At least one physical part A, 108, is scanned using a 3D scanner, 110. The other parts B, C, D, etc., represented as block 109, may be nominal or physical parts. If they are physical, they are measured as well using a 3D scanner 110. The measured parts and the nominal parts are sent to the memory 111 of a computer system, having a central processing unit (CPU) 112. The Virtual Assembling Module 115 virtually assembles the measured and nominal parts forming virtual representations of each part within one common coordinate system to reflect the assembly of parts. The Virtual Assembling Module 115 therefore communicates with both the Memory 111 and the CPU 112. Afterwards, the Interference Calculation Module 116 can determine an interference between both parts. The Interference Calculation Module 116 therefore also communicates with both the Memory 111 and the CPU 112. In 116, the measured and nominal parts forming the virtual representations are further converted such that the assembly can be represented as a collection of triangulated surfaces. These surfaces are then further sampled, and clearance values are generated using an algorithms for sampling and finding clearance values. The clearance values generated by the system are then sent to a display unit 114, such that these may be visualized and interpreted by a user.

Clearance is measured between two distinct parts whose geometry is defined in a common coordinate system. For a local clearance measurement to be valid, all of the part's surface in the neighborhood of the measurement are considered, as the computation has to consider the volume of material of the parts. The material thickness can be real (the two sides of the part's surface are measured), or virtual (one side is measured and the virtual thickness is used to compute the other side). The clearance is measured between surfaces having opposite orientation. When clearance is measured between two Thin Parts at a given point p, there are two possible clearance values, and the one with the smallest absolute value is chosen as the final clearance.

This section describes a method used to compute a clearance value at a given point $p_A$ on a given part A with respect to part B. It is assumed that a maximum clearance value, MC, is specified for bounding the search space. The algorithm proceeds as follows.

Figure 2A:
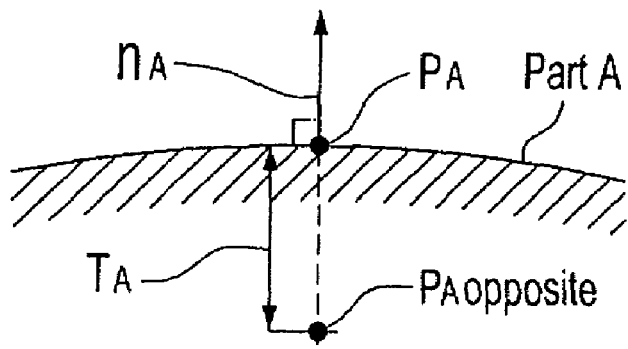
FIG. 2a shows one way of computing point $P_A$ and its corresponding point $P_{Aopposite}$ where part A has a virtual thickness specified.

First, $p_A$ and its corresponding point $p_{Aopposite}$ located on an opposite side of part A is computed. The normal vector $n_A$ at point $p_A$ is obtained by using the triangulated surface of part A. Referring to FIG. 2a, if part A has a virtual thickness specified, a point $p_{Aopposite}$ is defined as point $p_A$ translated by one thickness, $T_A$, along a direction opposite to normal vector $n_A$.

Figure 2B:
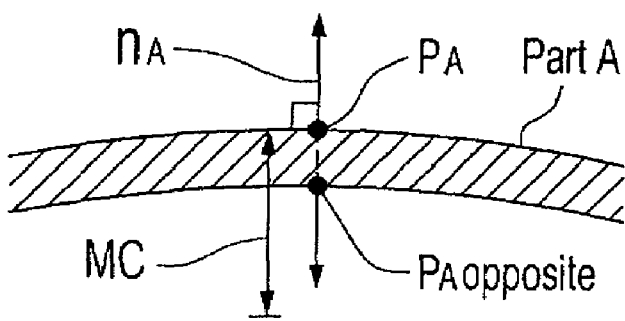
FIG. 2b shows another way of computing point $P_A$ and its corresponding point $P_{Aopposite}$ where part A does not have a virtual thickness and is thin.

Now referring to FIG. 2b, if part A does not have a virtual thickness, its real thickness can be determined if there is an opposite side within part A that is close to point $p_A$. A line segment of length maximum clearance, MC, passing through point $p_A$ and going in the direction opposite to $n_A$ is defined and intersected with the triangulated surface of part A. If an intersection is found, and the normal vector of the triangulated surface at the intersection point makes an angle exceeding 90 degrees with respect to $n_A$, the intersection point becomes point $p_{Aopposite}$ located on the a surface opposite to point $p_A$.

Figure 2C:
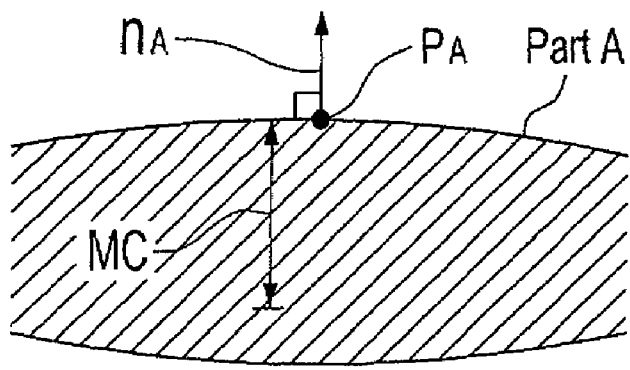
FIG. 2c shows another way of computing point $P_A$ and its corresponding point $P_{Aopposite}$ where part A does not have a virtual thickness and is thick.

Finally, if part A does not have a virtual thickness and no point $p_{Aopposite}$ could be found on a surface opposite to point $p_A$, as represented in FIG. 2c, then $p_{Aopposite}$ is void.

A second step is to compute $p_B$ and its corresponding point $p_{Bopposite}$ located on a surface opposite to point $p_B$ on part B.

Figure 3A:
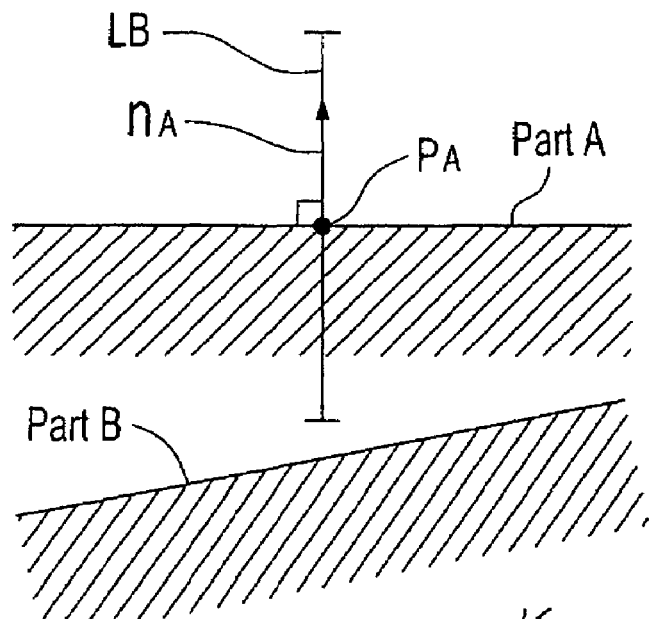
FIG. 3a shows one way of computing point $P_B$ and its corresponding point $P_{Bopposite}$ where part B has a virtual thickness and is not close to part A, or no intersection point is found between LB and part B.
Figure 3B:
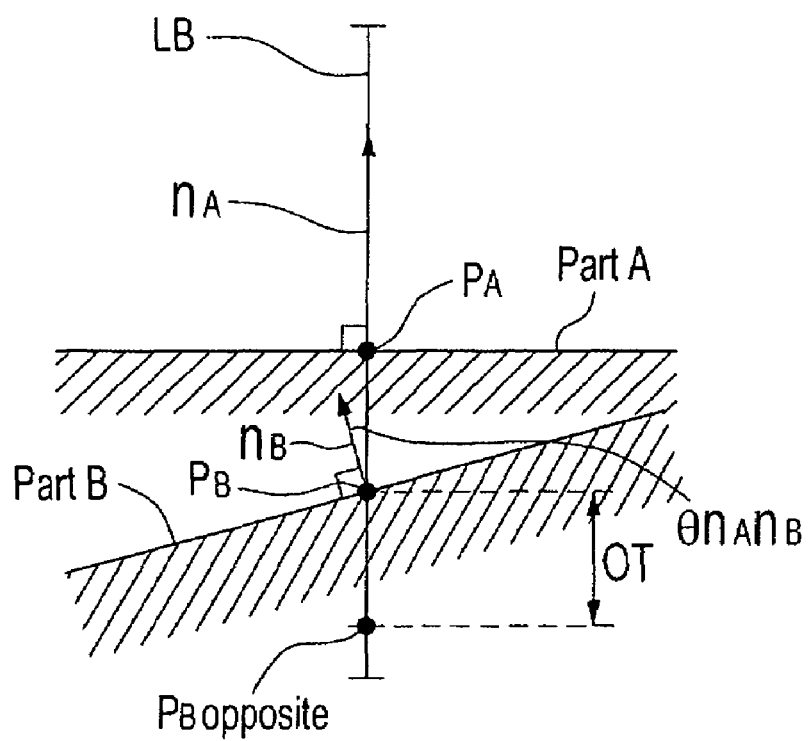
FIG. 3b shows another way of computing point $P_B$ and its corresponding point $P_{Bopposite}$ where part B has a virtual thickness and is close to part A, or an intersection point is found between LB and part B.

Referring to FIGS. 3a and 3b, if part B has a virtual thickness, $T_B$, a line segment LB centered at $p_A$ and having an orientation parallel to normal vector $n_A$ is created. If part A has a virtual thickness, $T_A$, the line segment LB has a length $L_{LB}$ equal to twice the sum of the maximum clearance MC with the virtual thicknesses of parts A and B:

$$L_{LB}=2(MC+T_A+T_B)$$

If part A has no virtual thickness, $T_A$, the line segment LB has a length $L_{LB}$ equal to twice the sum of the maximum clearance MC with the virtual thickness of part B:

$$L_{LB}=2(MC+T_B)$$

LB is then intersected with the triangulated surface of part B. If no intersection point is found, as represented in FIG. 3a, $p_B$ is void. If intersection points are found, as in FIG. 3b, the one closest to $p_A$ is kept and becomes point $p_B$. Normal vector at $p_B$ is $n_B$. Along the direction of normal vector $n_A$, the Oriented Thickness, OT, of part B is equal to thickness of part B, $T_B$, divided by the absolute value of the cosine of the angle between $n_A$ and $n_B$, $\theta_{nAnB}$:

$$OT=T_B/|\cos\theta_{nAnB}|$$

Therefore, a point $p_{Bopposite}$ is defined as point $p_B$ translated by one Oriented Thickness OT, along normal vector $n_A$, in a direction opposite to normal vector $n_B$, as shown in FIG. 3b.

Figure 4A:
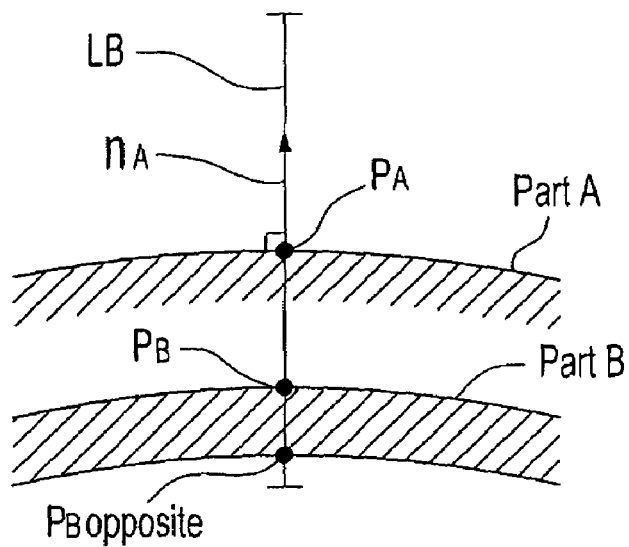
FIG. 4a shows yet another way of computing point $P_B$ and its corresponding point $P_{Bopposite}$ where part B does not have a virtual thickness, is thin, and is close to part A, or an intersection point is found between LB and part B.
Figure 4B:
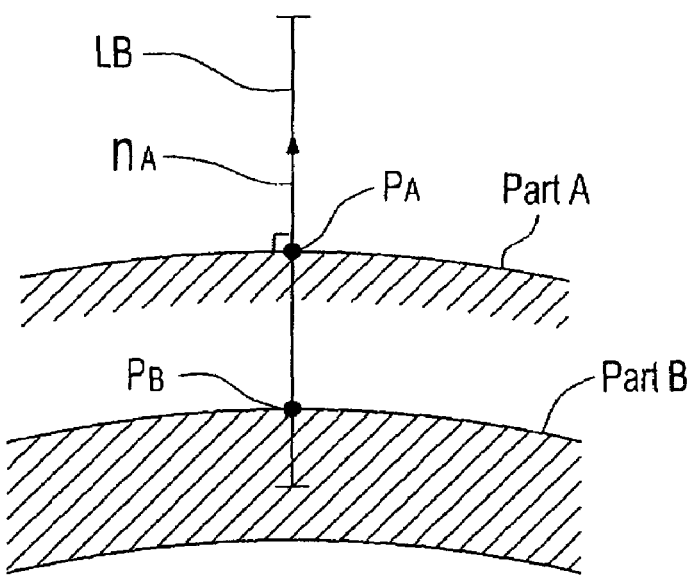
FIG. 4b shows yet another way of computing point $P_B$ and its corresponding point $P_{Bopposite}$ where part B does not have a virtual thickness, is thick, and is close to part A, or an intersection point is found between LB and part B.
Figure 4C:
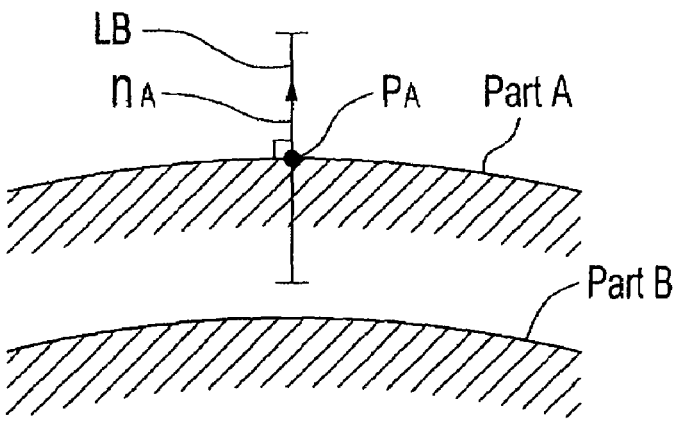
FIG. 4c shows yet another way of computing point $P_B$ and its corresponding point $P_{Bopposite}$ where part B does not have a virtual thickness, but is also not close to part A, or no intersection point is found between LB and part B.

Referring to FIGS. 4a, 4b and 4c, if part B does not have a virtual thickness, $T_B$, a line segment LB centered at $p_A$ and having an orientation parallel to normal vector $n_A$ is created. If part A has a virtual thickness, $T_A$, the line segment LB has a length $L_{LB}$ equal to twice the sum of the maximum clearance MC with the virtual thickness $T_A$ of part A:

$$L_{LB}=2(MC+T_A)$$

If part A has no virtual thickness $T_A$, the line segment LB has a length $L_{LB}$ equal to twice the maximum clearance MC:

$$L_{LB}=2(MC)$$

LB is then intersected with the triangulated surface of part B. The two intersection points closest to $p_A$ are kept. If two points are found, the closest becomes point $p_B$, and the second one becomes $p_{Bopposite}$, as shown in FIG. 4a. If one point is found, it becomes point $p_B$ and $p_{Bopposite}$ is void, as illustrated in FIG. 4b. Finally, if no point is found, as shown in FIG. 4c, both $p_B$ and $p_{Bopposite}$ are void.

Figure 5:
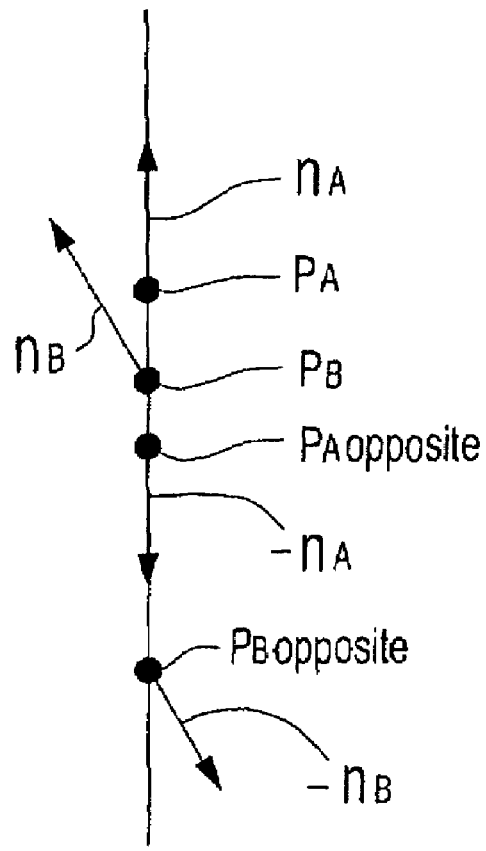
FIG. 5 illustrates how to match points $P_A$ and $P_{Aopposite}$ of part A to points $P_B$ and $P_{Bopposite}$ of part B.

A third step is to match points $p_A$ and $p_{Aopposite}$ to points $p_B$ and $p_{Bopposite}$. After the first two actions are done, there can be up to four points available, as represented in FIG. 5. All four points are located on an infinite line parallel to $n_A$ and passing through $p_A$. Below is a list of the four possible points, and whether or not they may or may not exist:

$p_A$ itself (always exists)

$p_{Aopposite}$ located on the opposite side of part A (may not exist)

$p_B$ closest point on part B along direction of $n_A$ (may not exist)

$p_{Bopposite}$ located on the opposite side of part B (may not exist)

Still referring to FIG. 5, the normal vector at $p_A$ is $n_A$. The normal vector at $p_{Aopposite}$ is set to $-n_A$. The normal vector at $p_B$ is $n_B$. The normal vector at $p_{Bopposite}$ is set to $-n_B$. All possible matches between the points of part A and part B are considered as follows:

$p_A$ to $p_B$ $p_A$ to $p_{Bopposite}$ $p_{Aopposite}$ to $P_B$ $p_{Aopposite}$ to $p_{Bopposite}$ For a match to be valid, the two points exist (no void points), and the angle between the normal vectors at the points exceeds 90 degrees. Given these conditions, the matching phase can generate 0, 1, or 2 matches between points on part A and points on part B.

The fourth step of the algorithm is to compute the clearance distances or values. For point $p_A$, the tangent plane passing through $p_A$ and perpendicular to vector $n_A$ is computed. The signed distance, DistanceP$_A$, between the matched B point (if it exists) and the tangent plane is computed. For point $p_{Aopposite}$ (if it exists), the tangent plane passing through $p_A$ and perpendicular to $-n_A$ is computed. The signed distance DistanceP$_{Aopposite}$ between the matched B point (if it exists) and the tangent plane is computed.

If no distance could be computed because no matched B points could be found when matching points $p_A$ and $p_{Aopposite}$ to points $p_B$ and $p_{Bopposite}$, clearance measurement is not available for $p_A$. If only one distance is valid, then this distance represents the clearance distance. If two valid distances are available, then the smallest one in absolute value is computed and is the clearance distance or value.

When the clearance value is positive, parts A and B do not interfere with each other. When the clearance value is negative, parts A and B interfere with each other.

Figure 6A:
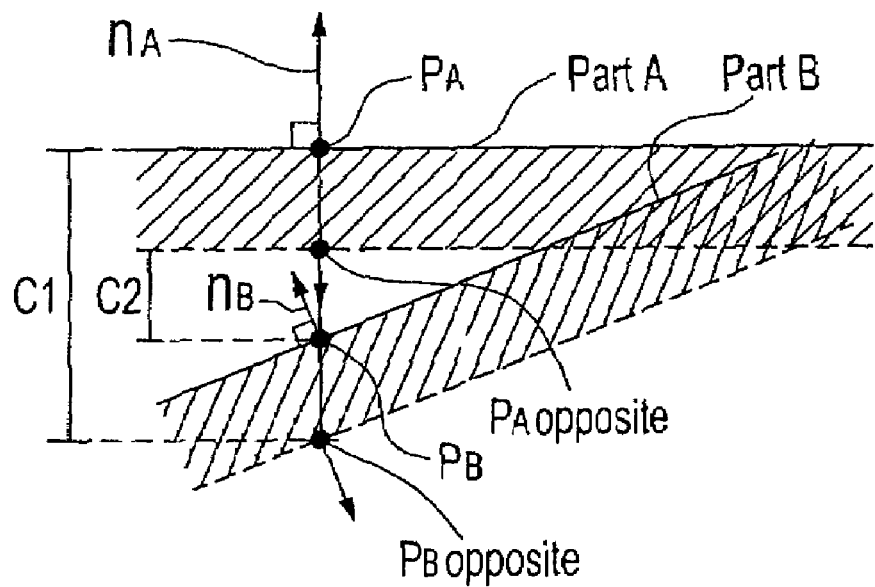
FIG. 6a shows one example for computing a clearance distance according to the fourth action in the method.

For example, FIG. 6a illustrates the situation where parts A and B have a virtual thickness and do not interfere at point $p_A$. In such a case, there are two possible clearance values. $C_2$ is positive and represents the signed distance between matched points $p_B$ and $p_{Aopposite}$. $C_1$ is negative and represents the signed distance between matched points $p_{Bopposite}$ and $p_A$. $C_2$ is the smallest in absolute value and is thus the clearance value.

Figure 6B:
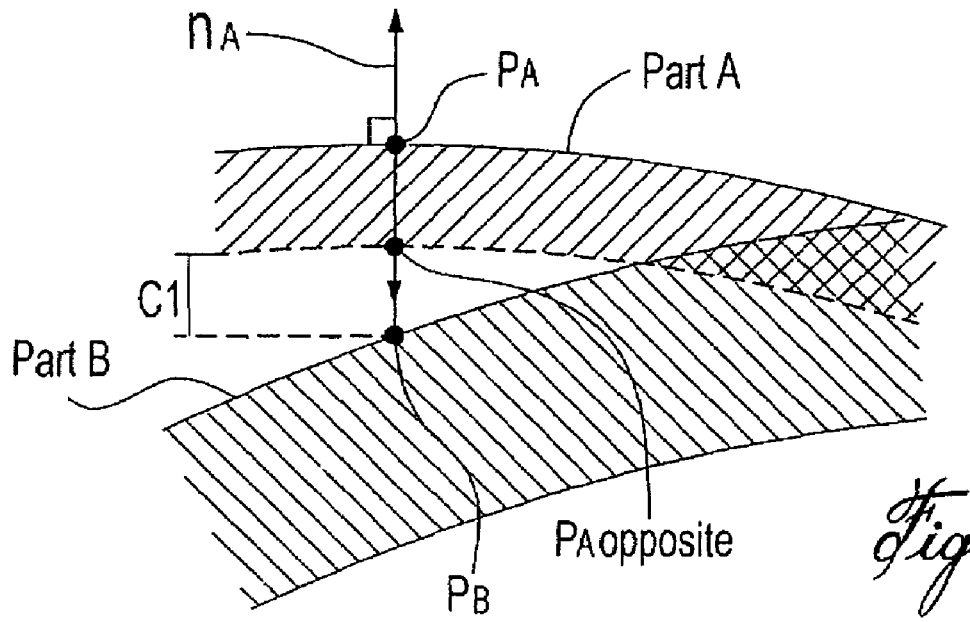
FIG. 6b shows a second example for computing a clearance distance according to the fourth action in the method.

In FIG. 6b, however, part A has a virtual thickness, but part B does not have a virtual thickness and is not thin. Parts A and B do not interfere at point $p_A$. $C_1$ is positive and represents the signed distance between point $p_{Aopposite}$ and $p_B$. $C_1$ is therefore the clearance value.

Figure 6C:
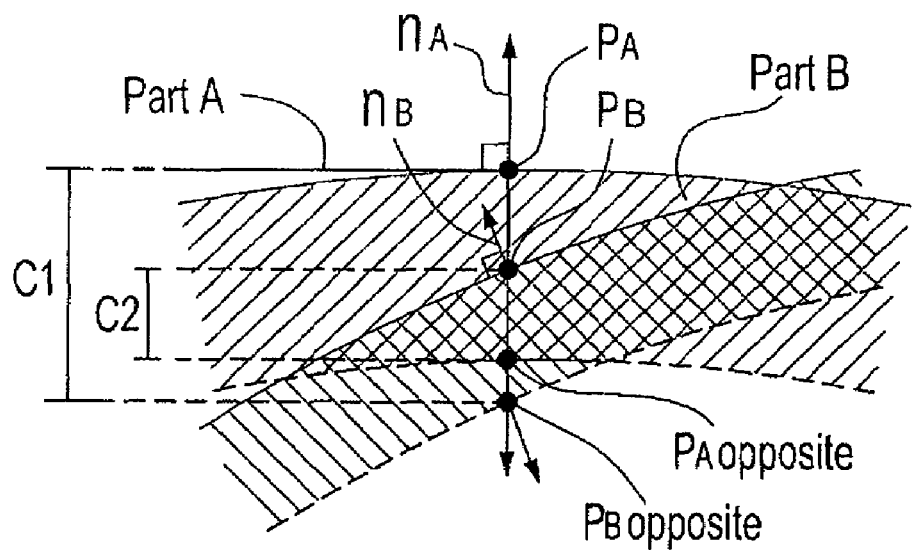
FIG. 6c shows yet another example for computing a clearance distance according to the fourth action in the method.

Finally, in FIG. 6c, parts A and B both have a virtual thickness and do interfere at point $p_A$ because point $p_{Aopposite}$ is within part B. The Clearance measurement is considered from both sides of part A. Hence, when an interference occurs along the virtual opposite side of part A, at point $p_{Aopposite}$, the interference is calculated at point $p_A$. As illustrated, there are two possible clearance values like in FIG. 6a. Here however, both distances $C_1$ and $C_2$ are negative. C1 represents the signed distance between matched points $p_{Bopposite}$ and $p_A$, while C2 represents the signed distance between matched points $p_B$ and $p_{Aopposite}$. Since, in this case, $C_2$ is the smallest in absolute value, clearance is $C_2$.

Figure 7:
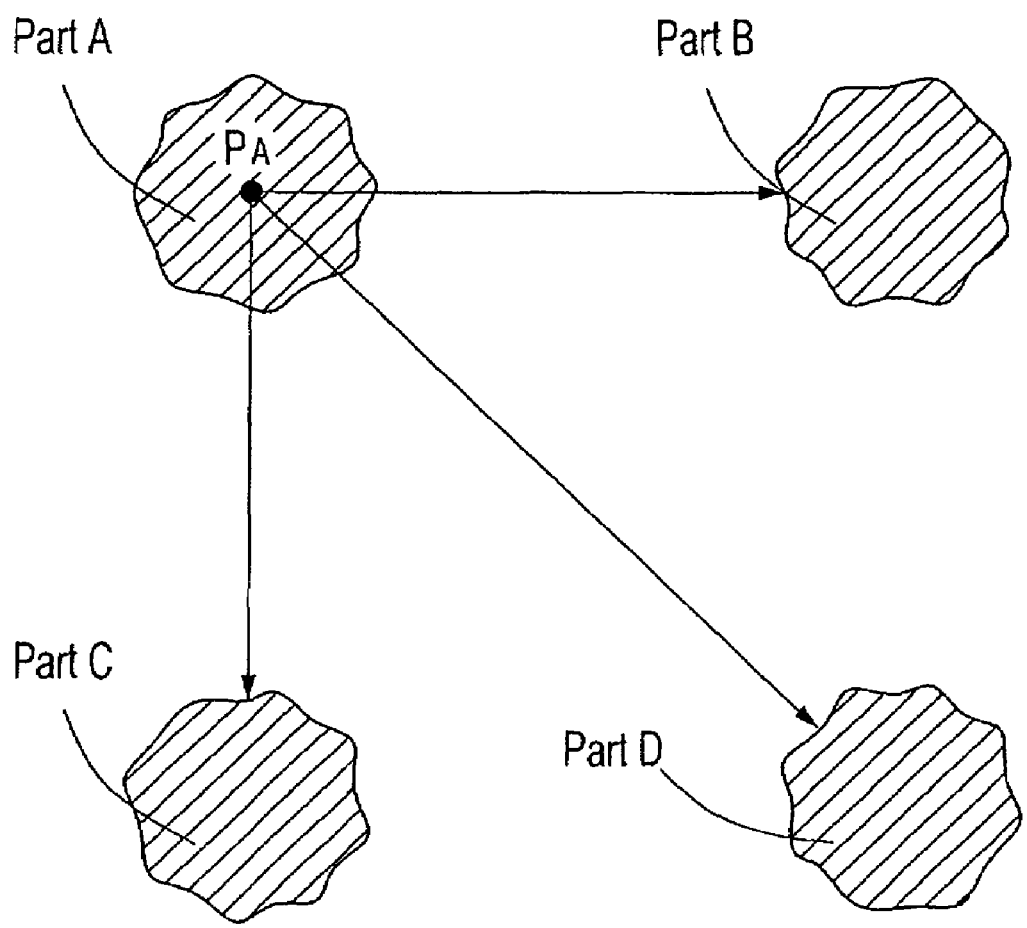
FIG. 7 illustrates the computation of the minimum clearance value in an assembly of many parts and according to one embodiment.

Referring to FIG. 7, the last step of the algorithm is to compute the minimum clearance. For point $p_A$ on part A, clearance is computed with respect to parts B, C, D, etc. The minimum clearance value is the smallest of all signed clearance values measured with respect to each other parts B, C, D, etc.

The clearance measurements can be visualized by converting minimum clearance or clearance values to colors using any value-to-color coding technique, mapping the colors corresponding to clearance values onto the measured and nominal part geometry, and displaying the measured and nominal part geometry on a computer screen using standard three-dimensional rendering techniques.

In summary, according to one aspect of the invention, there is provided a method for determining an interference between a first physical part and a second part in an assembly of manufactured parts. The method, as represented in FIG. 1a, comprises: acquiring three-dimensional digital data representing the first physical part: block 101; forming a virtual representation of the first physical part using the digital data, block 102; placing the virtual representation of the first physical part and a virtual representation of the second part in a common reference frame, the second part corresponding to one of a second physical part and a nominal part, block 103; and determining the interference between the first physical part and the second part using the virtual representation of the first physical part and the virtual representation of the second part, block 106.

According to yet another aspect of the invention, and this time referring to FIG. 1b, there is provided a system 200 for determining an interference between a first physical part 108 and a second part 109 in an assembly of manufactured parts, the system comprising: an acquisition device 110 for acquiring three-dimensional digital data representing the first physical part; a virtual assembling module 115 for receiving the three-dimensional digital data, forming a virtual representation of the first physical part using the digital data, and placing the virtual representation of the first physical part and a virtual representation of the second part in a common reference frame, the second part 109 corresponding to one of a second physical part and a nominal part; and a calculation module 116 for determining the interference between the first physical part 108 and the second part 109 using the virtual representation of the first physical part and the virtual representation of the second part.

The embodiments of the invention described above are intended to be exemplary only. The scope of the invention is therefore intended to be limited solely by the scope of the appended claims.

What is claimed is:

1. A method for determining an interference between a first physical part and at least a second part in an assembly of manufactured parts, said method comprising:
   acquiring three-dimensional digital data representing a single surface of said first physical part;
   forming a virtual representation of said first physical part using said digital data, said virtual representation comprising a virtual surface opposite to said single surface having a virtual thickness;
   placing said virtual representation of said first physical part and a virtual representation of said second part in a common reference frame, said second part corresponding to one of a second physical part and a nominal part; and
   determining said interference between said first physical part and said second part using said virtual representation of said first physical part and said virtual representation of said second part.

2. The method as in claim 1, wherein said determining comprises computing a distance between said second part and a given point located on said first physical part.

3. The method as in claim 1, wherein said determining comprises computing a plurality of distances between said second part and a plurality of given points located on said first physical part.

4. The method as in claim 3, wherein said computing comprises selecting a minimum distance among said plurality of distances.

5. The method as in claim 1, wherein said determining comprises computing a distance between said first physical part and a given point located on said second part.

6. The method as in claim 1, wherein said determining comprises computing a plurality of distances between said first physical part and a plurality of given points located on said second part.

7. The method as in claim 6, wherein said computing further comprises selecting a minimum distance among said plurality of distances.

8. The method as in claim 1, further comprising displaying said virtual representation of said first physical part and said virtual representation of said second part.

9. A system for determining an interference between a first physical part and a second part in an assembly of manufactured parts, said system comprising:
   an acquisition device for acquiring three-dimensional digital data representing a single surface of said first physical part;
   a virtual assembling module for receiving said three-dimensional digital data, forming a virtual representation of said first physical part using said digital data, said virtual representation comprising a virtual surface opposite to said single surface having a virtual thickness, and placing said virtual representation of said first physical part and a virtual representation of said second part in a common reference frame, said second part corresponding to one of a second physical part and a nominal part; and
   a calculation module for determining said interference between said first physical part and said second part using said virtual representation of said first physical part and said virtual representation of said second part.

10. The system as in claim 9, wherein said calculation module computes a distance between said second part and a given point located on said first physical part.

11. The system as in claim 9, wherein said calculation module computes a plurality of distances between said second part and a plurality of given points located on said first physical part, and selects a minimum distance among said plurality of distances.

12. The system as in claim 9, wherein said calculation module computes a distance between said first physical part and a given point located on said second part.

13. The system as in claim 9, wherein said calculation module computes a plurality of distances between said first physical part and a plurality of given points located on said second part, and selecting a minimum distance among said plurality of distances.

14. The system as in claim 9, further comprising a display unit for displaying said virtual representation of said first physical part and said virtual representation of said second part.

* * * * *